US008922265B1

(12) United States Patent
Bai et al.

(10) Patent No.: US 8,922,265 B1
(45) Date of Patent: Dec. 30, 2014

(54) NOISE CURRENT COMPENSATION CIRCUIT

(71) Applicant: Southeast University, Jiangsu (CN)

(72) Inventors: Na Bai, Jiangsu (CN); Longxing Shi, Jiangsu (CN); Jun Yang, Jiangsu (CN); Xinning Liu, Jiangsu (CN); Jiafeng Zhu, Jiangsu (CN); Yue Feng, Jiangsu (CN); Cai Gong, Jiangsu (CN); Fei Pan, Jiangsu (CN); Hong Chang, Jiangsu (CN); Yifeng Deng, Jiangsu (CN); Yuan Chen, Jiangsu (CN); Yingcheng Xia, Jiangsu (CN)

(73) Assignee: Southeast University (CN)

( * ) Notice: Subject to any disclaimer, the term of this patent is extended or adjusted under 35 U.S.C. 154(b) by 0 days.

(21) Appl. No.: 14/369,652

(22) PCT Filed: Dec. 27, 2012

(86) PCT No.: PCT/CN2012/087721
§ 371 (c)(1),
(2), (4) Date: Jun. 27, 2014

(87) PCT Pub. No.: WO2013/097750
PCT Pub. Date: Jul. 4, 2013

(30) Foreign Application Priority Data

Dec. 28, 2011 (CN) .......................... 2011 1 0449322

(51) Int. Cl.
*H03L 5/00* (2006.01)
*H03K 3/013* (2006.01)
*H03K 3/012* (2006.01)

(52) U.S. Cl.
CPC ................ *H03K 3/013* (2013.01); *H03K 3/012* (2013.01)
USPC .......................................... 327/313; 327/362

(58) Field of Classification Search
None
See application file for complete search history.

(56) References Cited

U.S. PATENT DOCUMENTS

| 5,517,452 | A | 5/1996 | Mehalal ........................ 365/203 |
| 6,724,244 | B2* | 4/2004 | Wu ................................ 327/543 |
| 6,956,417 | B2* | 10/2005 | Bernstein et al. ............. 327/157 |
| 7,495,507 | B2* | 2/2009 | Choi ............................. 327/543 |
| 2002/0075702 | A1 | 6/2002 | Igarashi et al. ................. 363/35 |
| 2005/0281109 | A1 | 12/2005 | Martelloni et al. ........... 365/206 |
| 2006/0097774 | A1 | 5/2006 | Hasegawa ..................... 327/538 |
| 2011/0063004 | A1* | 3/2011 | Chen et al. ................... 327/157 |

FOREIGN PATENT DOCUMENTS

| CN | 1360392 | 7/2002 | ............... H02M 7/48 |
| CN | 1717747 | 1/2006 | ........... G11C 11/412 |
| CN | 1790217 | 6/2006 | ................ G05F 1/62 |
| CN | 1811656 | 8/2006 | ................ G05F 3/16 |
| CN | 101025638 | 8/2007 | ................ G05F 3/24 |
| CN | 102496384 | 6/2012 | ........... G11C 11/413 |

OTHER PUBLICATIONS

International Search Report issued in corresponding PCT Patent Appln. Serial No. PCT/CN2012/087721, with English translation, dated Mar. 7, 2013 (4 pgs).

* cited by examiner

*Primary Examiner* — Cassandra Cox
(74) *Attorney, Agent, or Firm* — Hayes Soloway P.C.

(57) ABSTRACT

Disclosed is a noise current compensation circuit. The circuit is provided with two input and output terminals A and B, and two control terminals CON and CONF. The control terminals control a work mode (work state and pre-charge state) of the compensation circuit. The compensation circuit consists of 7 PMOS transistors and 8 NMOS transistors. In the normal work state, by detecting changes of potential change rate of two signal lines in an original circuit, the noise current compensation circuit automatically enables one end of the original circuit that discharges slowly to discharge a signal more slowly, and enables one end of the original circuit that discharges rapidly to discharge a signal more rapidly, thus eliminating the influence of the noise current on the circuit and providing assistance for correct identification of subsequent circuit signals. The current compensation circuit can be used for an SRAM bit line leakage current compensation circuit, because the existence of a large leakage current on the SRAM bit line leads to the decreasing of a voltage difference between two ends of the bit line, resulting in that a subsequent circuit cannot correctly identify a signal.

1 Claim, 6 Drawing Sheets

NOISE CURRENT COMPENSATION CIRCUIT

TECHNICAL FIELD

The present invention relates to a noise current compensation circuit which makes compensation for a circuit with high noise current and thereby eliminates the adverse effects of noise current on the compensated circuit, and belongs to the technical field of integrated circuit design. The designed noise current compensation circuit can be applied to leak current compensation for SRAM bit lines, in view that the leak current in SRAM bit lines may result in decreased voltage difference between two bit lines and thereby cause the follow-up circuit to be unable to identify the signals correctly if the leak current is heavy.

BACKGROUND ART

Noise current in a circuit refers to the part of current which disturbs normal operation of the circuit. Though noise current is inevitable in a circuit, the impact of noise current is non-ignorable. Especially, as the CMOS technology advances, the impact of leak current on the circuit becomes more and more severe along with working voltage and threshold voltage drop in the circuit, making the circuit unstable. When the leak current as noise current threatens the normal operation of the circuit, measures must be taken to eliminate the adverse effects of the noise current on the circuit and thus improve stability of the circuit.

CONTENTS OF INVENTION

Object of invention: in view of the problems and drawbacks in the prior art, the present invention provides a noise current compensation circuit for eliminating noise current and improving stability of circuit.

Technical solution: a noise current compensation circuit, comprising seven PMOS tubes (i.e. a first PMOS tube P1, a second PMOS tube P2, a third PMOS tube P3, a fourth PMOS tube P4, a fifth PMOS tube P5, a sixth PMOS tube P6, and a seventh PMOS tube P7) and eight NMOS tubes (i.e. a first NMOS tube N1, a second NMOS tube N2, a third NMOS tube N3, a fourth NMOS tube N4, a fifth NMOS tube N5, a sixth NMOS tube N6, a seventh NMOS tube N7, and a eighth NMOS tube N8). The noise current compensation circuit has two I/O terminals (a first I/O terminal A and a second I/O terminal B) and two complementary control signals CON and CONF.

Wherein:

the source electrode of the first PMOS tube P1 is connected to the supply voltage VDD, the drain electrode of the first PMOS tube P1 is connected to the second I/O terminal B, and the gate electrode of the first PMOS tube P1 is connected to the drain electrode of the second PMOS tube P2; the source electrode of the second PMOS tube P2 is connected to the supply voltage VDD, the gate electrode of the second PMOS tube P2 is connected to the gate electrode of the third NMOS tube N3 and connected to the control signal CON; the source electrode of the third NMOS tube N3 is connected to the source electrode of the third PMOS tube P3 and connected to the drain electrode of the second PMOS tube P2, and the drain electrode of the third NMOS tube N3 is connected to the drain electrode of the third PMOS tube P3; the gate electrode of the third PMOS tube P3 is connected to the signal CONF which is complementary to the control signal CON; the drain electrode of the fourth PMOS tube P4 is connected to the drain electrode of the fourth NMOS tube N4 and connected to the drain electrode of the third PMOS tube P3; the source electrode of the fourth PMOS tube P4 is connected to the supply voltage VDD, the gate electrode of the fourth PMOS tube P4 is connected to the gate electrode of the fifth PMOS tube P5 and connected to the gate electrode of the seventh PMOS tube P7; the gate electrode of the fifth PMOS tube P5 is connected to the drain electrode of the fifth PMOS tube P5 and connected to the drain electrode of the fifth NMOS tube N5, and the source electrode of the fifth PMOS tube P5 is connected to the supply voltage VDD; the gate electrode of the fourth NMOS tube N4 is connected to the gate electrode of the seventh NMOS tube N7 and directly connected to the second I/O terminal B, the gate electrode of the fifth NMOS tube N5 is directly connected to the first I/O terminal A, and the source electrode of the fourth NMOS tube N4 is connected to the source electrode of the fifth NMOS tube N5 and connected to the drain electrode of the eighth NMOS tube N8; the source electrode of the seventh PMOS tube P7 is directly connected to the supply voltage VDD; the drain electrode of the seventh PMOS tube P7 is connected to the drain electrode of the seventh NMOS tube N7, and the source electrode of the seventh NMOS tube N7 is connected to the drain electrode of the eighth NMOS tube N8; the gate electrode of the eighth NMOS tube N8 is connected to the control signal CON, and the source electrode of the eighth NMOS tube N8 is directly connected to the power ground VSS; the source electrode of the sixth PMOS tube P6 is connected to the source electrode of the sixth NMOS tube N6 and connected to the drain electrode of the seventh NMOS tube N7, and the drain electrode of the sixth PMOS tube P6 is connected to the drain electrode of the sixth NMOS tube N6 and connected to the gate electrode of the first NMOS tube N1; the gate electrode of the sixth PMOS tube P6 is directly connected to the control signal CONF, the gate electrode of the sixth NMOS tube N6 is directly connected to the control signal CON, the gate electrode of the second NMOS tube N2 is directly connected to the control signal CONF, the source electrode of the second NMOS tube N2 is directly connected to the power ground VSS, and the drain electrode of the second NMOS tube N2 is connected to the gate electrode of the NMOS tube N1; the source electrode of the first NMOS tube N1 is directly connected to the power ground VSS, and the drain electrode of the first NMOS tube N1 is directly connected to the second I/O terminal B;

in addition, the body terminals of the first PMOS tube P1, second PMOS tube P2, third PMOS tube P3, fourth PMOS tube P4, fifth PMOS tube P5, sixth PMOS tube P6, and seventh PMOS tube P7 are connected to the supply voltage VDD respectively; the body terminals of the first NMOS tube N1, second NMOS tube N2, third NMOS tube N3, fourth NMOS tube N4, fifth NMOS tube N5, sixth NMOS tube N6, seventh NMOS tube N7, and eighth NMOS tube N8 are connected to the power ground VSS respectively.

Beneficial effects: compared to the prior art, the noise current compensation circuit provided in the present invention detects the potential change rates of the two signal wires in the original circuit in normal operation state, and automatically controls the signal terminal that discharges at a lower rate to discharge more slowly while controls the signal terminal that discharges at a higher rate to discharge more quickly, and thereby eliminates the adverse effects of noise current on the original circuit, improves stability of the circuit, and provides aids to the follow-up circuit to correctly identify the circuit signals. The circuit provided in the present invention can be used for current compensation for SRAM bit lines, in view that the leak current in SRAM bit lines may result in decreased potential difference between the two terminals of the bit lines and cause the follow-up circuit to be unable to correctly identify the signals if the leak current is heavy.

DETAILED DESCRIPTION OF THE EMBODIMENTS

Hereunder the present invention will be further detailed in embodiments, with reference to the accompanying drawings. It should be appreciated that these embodiments are provided only for describing the present invention, and shall not be deemed as constituting any limitation to the scope of the present invention. Those skilled in the art can make various equivalent modifications to the present invention without departing from the spirit of the present invention, but all these modifications shall be deemed as falling into the protection scope as confined by the attached claims.

Figure 1:
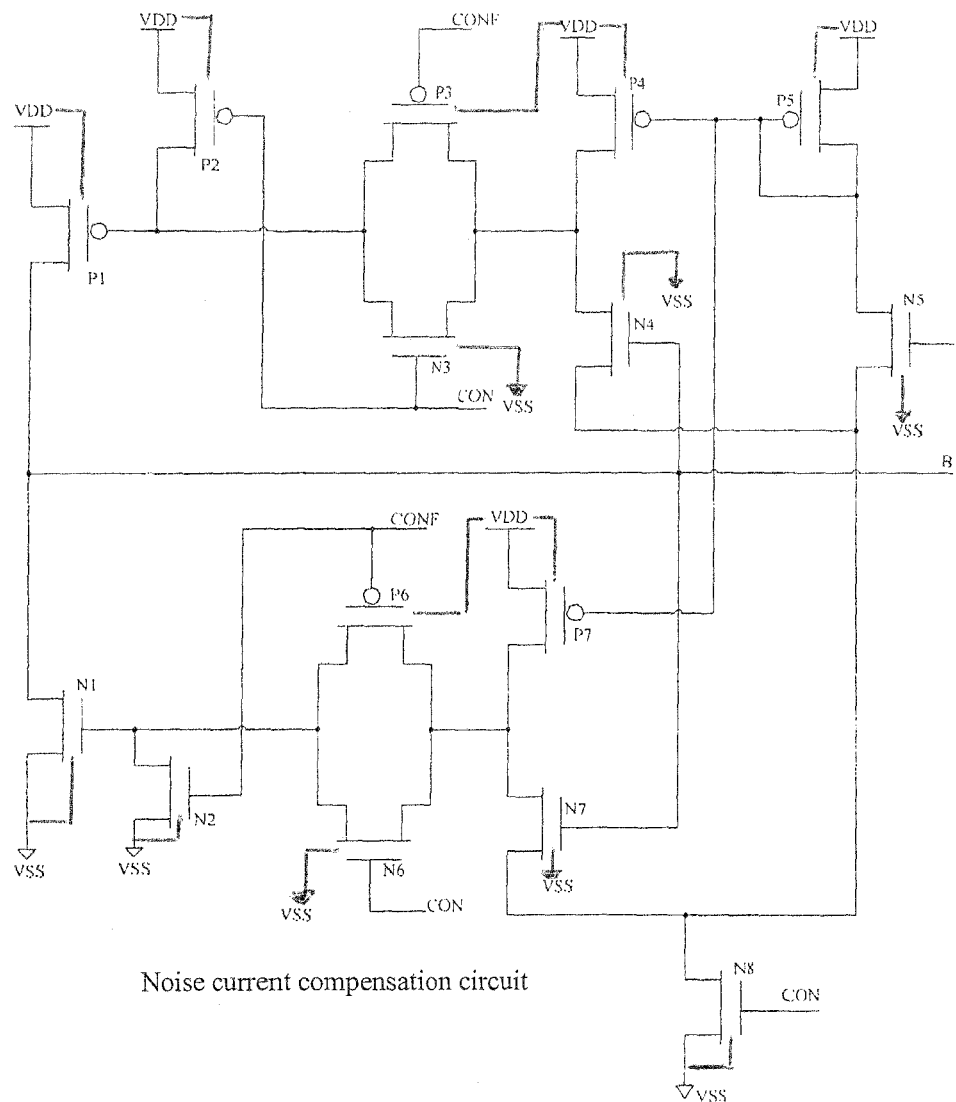
FIG. 1 is a structural diagram of an embodiment of the circuit in the present invention.

As shown in FIG. 1, the noise current compensation circuit in an embodiment of the present invention comprises 7 PMOS tubes (i.e. a first PMOS tube P1, a second PMOS tube P2, a third PMOS tube P3, a fourth PMOS tube P4, a fifth PMOS tube P5, a sixth PMOS tube P6, and a seventh PMOS tube P7) and 8 NMOS tubes (i.e. a first NMOS tube N1, a second NMOS tube N2, a third NMOS tube N3, a fourth NMOS tube N4, a fifth NMOS tube N5, a sixth NMOS tube N6, a seventh NMOS tube N7, and a eighth NMOS tube N8). The noise current compensation circuit has two I/O terminals (a first I/O terminal A and a second I/O terminal B) and two complementary control signals CON and CONF.

The connection relation among the tubes is as follows: the source electrode of the first PMOS tube P1 is connected to the supply voltage VDD, the drain electrode of the first PMOS tube P1 is connected to the second I/O terminal B, and the gate electrode of the first PMOS tube P1 is connected to the drain electrode of the second PMOS tube P2; the source electrode of the second PMOS tube P2 is connected to the supply voltage VDD, the gate electrode of the second PMOS tube P2 is connected to the gate electrode of the third NMOS tube N3 and connected to the control signal CON; the source electrode of the third NMOS tube N3 is connected to the source electrode of the third PMOS tube P3 and connected to the drain electrode of the second PMOS tube P2, the drain electrode of the third NMOS tube N3 is connected to the drain electrode of the third PMOS tube P3, and the gate electrode of the third PMOS tube P3 is connected to the signal CONF which is complementary to the control signal CON; the drain electrode of the fourth PMOS tube P4 is connected to the drain electrode of the fourth NMOS tube N4 and connected to the drain electrode of the third PMOS tube P3; the source electrode of the fourth PMOS tube P4 is connected to the supply voltage VDD, the gate electrode of the fourth PMOS tube P4 is connected to the gate electrode of the fifth PMOS tube P5 and connected to the gate electrode of the seventh PMOS tube P7; the gate electrode of the fifth PMOS tube P5 is connected to the drain electrode of the fifth PMOS tube P5 and connected to the drain electrode of the fifth NMOS tube N5, and the source electrode of the fifth PMOS tube P5 is connected to the supply voltage VDD; the gate electrode of the fourth NMOS tube N4 is connected to the gate electrode of the seventh NMOS tube N7 and directly connected to the second I/O terminal B, the gate electrode of the fifth NMOS tube N5 is directly connected to the first I/O terminal A, and the source electrode of the fourth NMOS tube N4 is connected to the source electrode of the fifth NMOS tube N5 and connected to the drain electrode of the eighth NMOS tube N8; the source electrode of the seventh PMOS tube P7 is directly connected to the supply voltage VDD, the drain electrode of the seventh PMOS tube P7 is connected to the drain electrode of the seventh NMOS tube N7, and the source electrode of the seventh NMOS tube N7 is connected to the drain electrode of the eighth NMOS tube N8; the gate electrode of the eighth NMOS tube N8 is connected to the control signal CON, and the source electrode of the eighth NMOS tube N8 is directly connected to the power ground VSS; the source electrode of the sixth PMOS tube P6 is connected to the source electrode of the sixth NMOS tube N6 and connected to the drain electrode of the seventh NMOS tube N7; the drain electrode of the sixth PMOS tube P6 is connected to the drain electrode of the sixth NMOS tube N6 and connected to the gate electrode of the first NMOS tube N1; the gate electrode of the sixth PMOS tube P6 is directly connected to the control signal CONF, and the gate electrode of the sixth NMOS tube N6 is directly connected to the control signal CON; the gate electrode of the second NMOS tube N2 is directly connected to the control signal CONF, the source electrode of the second NMOS tube N2 is directly connected to the power ground VSS, and the drain electrode of the second NMOS tube N2 is connected to the gate electrode of the first NMOS tube N1; the source electrode of the first NMOS tube N1 is directly connected to the power ground VSS, and the drain electrode of the first NMOS tube N1 is directly connected to the second I/O terminal B;

In addition, the body terminals of the first PMOS tube P1, second PMOS tube P2, third PMOS tube P3, fourth PMOS tube P4, fifth PMOS tube P5, sixth PMOS tube P6, and seventh PMOS tube P7 are connected to the supply voltage VDD respectively; the body terminals of the first NMOS tube N1, second NMOS tube N2, third NMOS tube N3, fourth NMOS tube N4, fifth NMOS tube N5, sixth NMOS tube N6, seventh NMOS tube N7, and eighth NMOS tube N8 are connected to the power ground VSS respectively.

Figure 2:
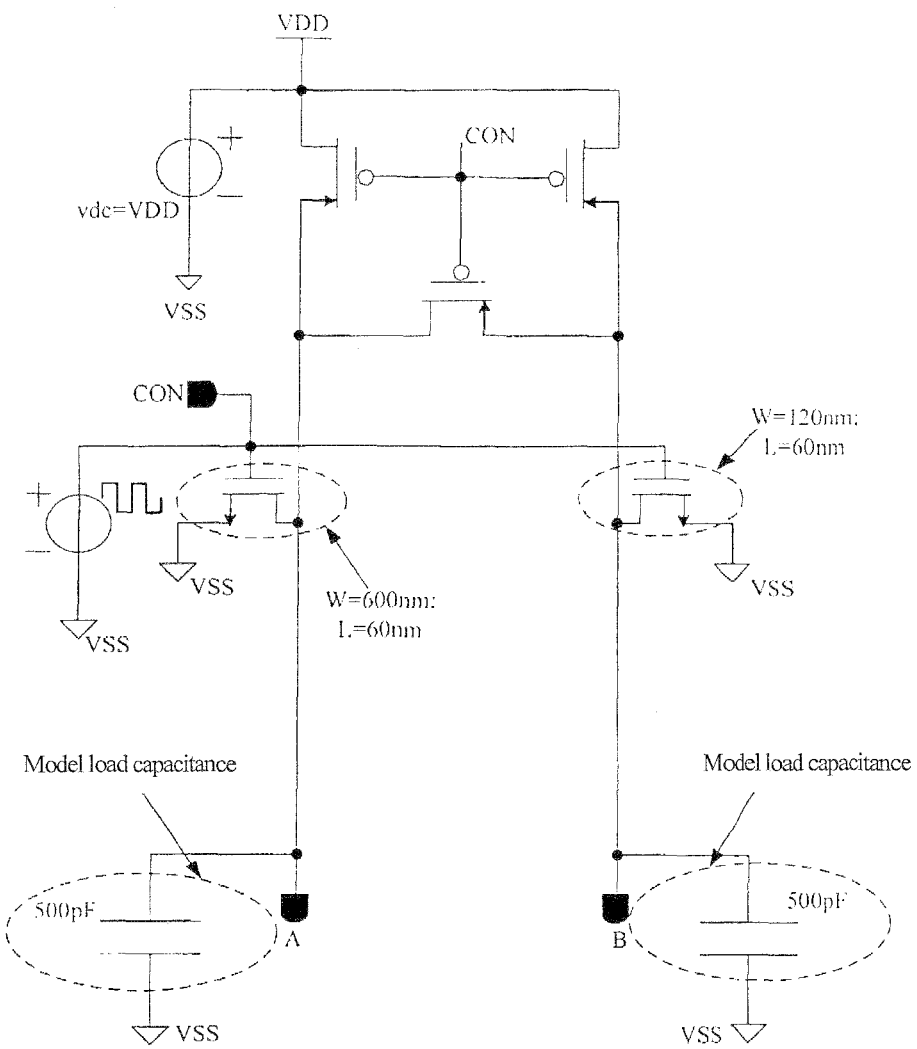
FIG. 2 is a structural diagram of a circuit designed to simulate noise current.

Please see FIG. 2, in the circuit model, there are two signal wires X and Y; a capacitor C1 and a capacitor C2 are used to simulate the load capacitance in signal wires X and Y respectively, and both of them are 500 pF. In the circuit model, a first NMOS tube N1 (W=600 nm, L=60 nm) is used to simulate the working current in the circuit, a second NMOS tube N2 (W=120 nm, L=60 nm) is used to simulate the noise current in the circuit. It is seen that the working current is 5 times of the noise current when the circuit starts to work. The first PMOS tube P1, second PMOS tube P2, and third PMOS tube P3 are used to initialize the original circuit, and all of them are in OFF state when the circuit starts to work. In addition, CON is a control signal for the circuit, and is used to control the circuit state. When CON="0", the first PMOS tube P1, second PMOS tube P2, and third PMOS tube P3 are in ON state, and thus the potentials of the two signal wires X and Y are at the supply voltage VDD; in that state, the first NMOS tube N1 and second NMOS tube N2 are in OFF state, and therefore the circuit is in a pre-charge state, i.e., initialization state; when CON="1", the circuit is in normal working state; in that state, the first NMOS tube N1 and second NMOS tube N2 are in ON state, the first PMOS tube P1, second PMOS tube P2, and third PMOS tube P3 are in OFF state, and the working current and noise current discharge on the signal wires X and Y. The SA shown in the diagram is a sense amplifier, designed to detect and amplify the potential difference between the two signal wires X and Y. The supply voltage VDD of the circuit is 1.2V.

Figure 3:
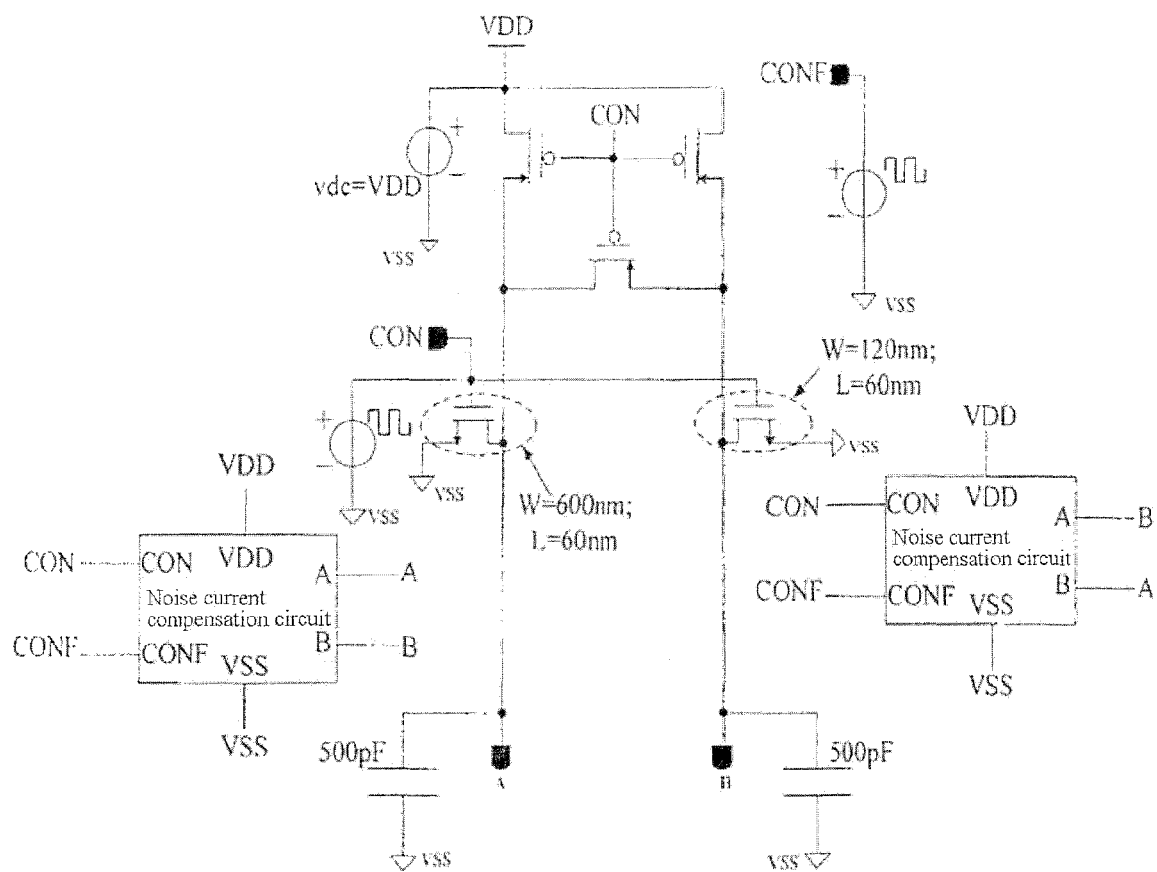
FIG. 3 is a structural diagram of a circuit which includes the noise current compensation circuit in the present invention.

The working principle of the noise current compensation circuit in the present invention is as follows:

The connection relation among the noise current compensation circuits provided by the main circuit is shown in FIG. 3. The supply voltage VDD is 1.2V, and CON and CONF are a pair of complementary control signals; when CON="0", CONF="1", the two signal wires X and Y in the main circuit are in pre-charge state, and the third PMOS tube P3 and third NMOS tube N3, sixth PMOS tube P6 and sixth NMOS tube N6, and eighth NMOS tube N8 in the compensation circuit are in OFF state; in that state, the second PMOS tube P2 is in ON state and therefore the gate voltage of the first PMOS tube P1 is VDD, the second NMOS tube N2 is in ON state and therefore the gate voltage of the first NMOS tube N1 is VSS, thus, the first PMOS tube P1 and first NMOS tube N1 are in OFF state, the noise current compensation circuit has no effect on the original circuit, and the entire circuit is in initialization state, as shown in FIG. 1 and FIG. 3. When CON="1", CONF="0", the circuit enters into working state. In that state, the working current starts to discharge on the terminal X in the original circuit, and the noise current starts to discharge on the terminal Y in the original circuit. Since the working current is 5 times of the noise current and the load capacitance in the wire X is equal to the load capacitance in the wire Y, the SR (slew rate) of X is higher than the SR of Y. In addition, the third PMOS tube P3, third NMOS tube N3, sixth PMOS tube P6, sixth NMOS tube N6, and eighth NMOS tube N8 in the noise current compensation circuit are turned on at the same time, and the second NMOS tube N2 and second PMOS tube P2 are turned off at the same time, in that state, the compensation circuit starts to work. Please see FIG. 1, if the discharge rate of the second I/O terminal B is higher than which of the terminal A (i.e., the SR of terminal B is higher than the SR of terminal A), the drain potentials of the fourth PMOS tube P4 and fourth NMOS tube N4 and the drain potentials of the seventh PMOS tube P7 and seventh NMOS tube N7 will increase accordingly; consequently, the gate voltage of the first PMOS tube P1 and the gate voltage of the first NMOS tube N1 will increase accordingly, resulting in continuously decreased driving power of the first PMOS tube P1 and continuously increased driving power of the first NMOS tube N1, thus, the potential of terminal B will be pulled down continuously. As the potential of terminal B is pulled down, the discharge rate of terminal B will be increased; therefore, if the SR of terminal B is higher than the SR of terminal A in the initial state, the compensation circuit will provide a positive feedback loop to the original circuit, so that the signal terminal that discharges at a higher rate in the original circuit will discharge more quickly.

In contrast, if the SR of the second I/O terminal B is lower than the SR of the first I/O terminal A in the initial state, the drain potentials of the fourth PMOS tube P4 and fourth NMOS tube N4 and the drain potentials of the seventh PMOS tube P7 and seventh NMOS tube N7 will decrease accordingly, and consequently the gate voltages of the first PMOS tube P1 and the gate voltage of the first NMOS tube N1 will decrease accordingly, resulting in continuously decreased driving power of the first NMOS tube N1 and continuously increased driving power of the first PMOS tube P1, thus, the potential of terminal B will be pulled up continuously. As the potential of terminal B is pulled up, the discharge rate of terminal B will be suppressed; therefore, if the SR of terminal B is lower than the SR of terminal A in the initial state, the compensation circuit will also provide a positive feedback loop to the original circuit, so that the signal terminal that discharges at a lower rate in the original circuit will discharge more slowly.

In that way, after the noise current compensation circuit is employed in the original circuit, the noise current compensation circuit will automatically control the terminal that discharges at a lower rate in the original circuit to discharge more slowly while control the terminal that discharges at a higher rate in the original circuit to discharge more quickly, according to the potential change rates in the two signal wires in the original circuit, and thereby this eliminates the adverse effect of noise current on the circuit and provides aids to the follow-up circuit to correctly identify the circuit signals.

Figure 4:
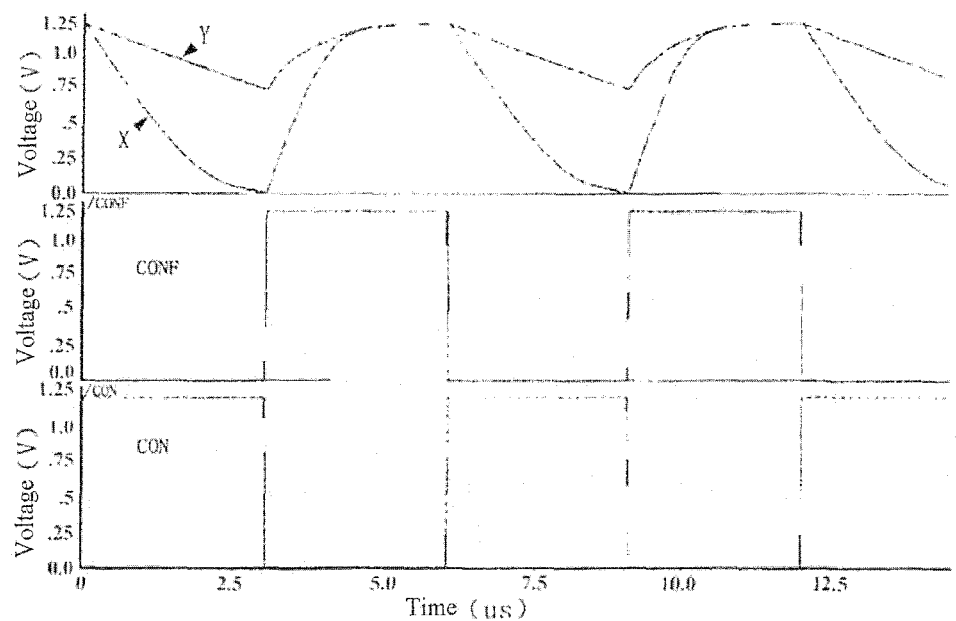
FIG. 4 is a signal simulation oscillogram without the noise current compensation circuit.
Figure 5:
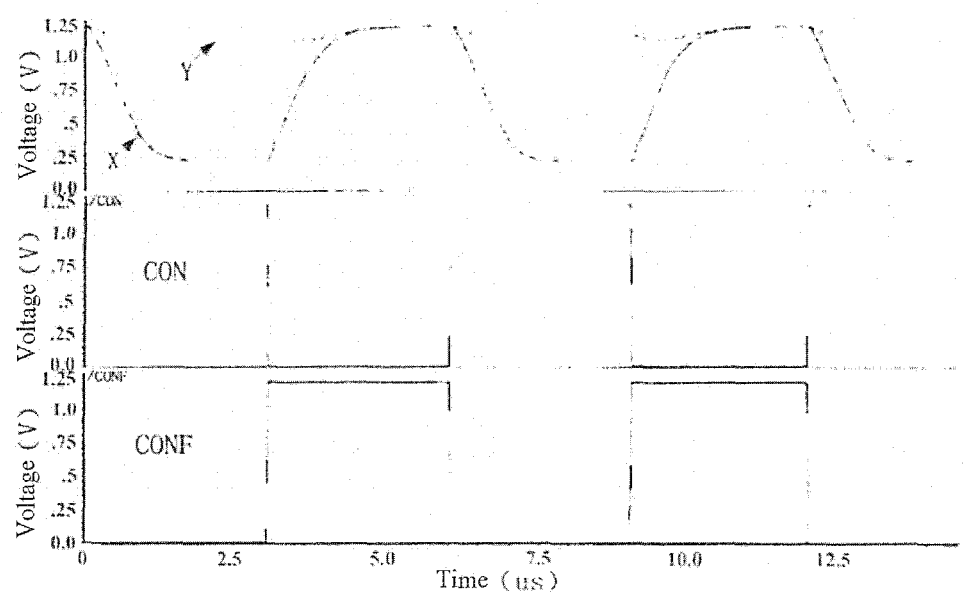
FIG. 5 is a signal simulation oscillogram with the noise current compensation circuit.

FIG. 4 shows a signal oscillogram without the compensation circuit; FIG. 5 shows the signal oscillogram with the compensation circuit. The effect of noise current on the circuit can be seen from FIG. 4: the high noise current will disturb correct signal identification of the follow-up circuit and threaten circuit stability.

For example, suppose the target potential difference is ½ VDD (i.e., 600 mV potential difference), the required time differences ΔT (from the time when the circuit starts to work to the time when the 600 mV potential difference is established) under five different process corner conditions at room temperature in the two cases are shown in Table 1:

TABLE 1

| | | ΔT (μs) | | | | |
| --- | --- | --- | --- | --- | --- | --- |
| | ΔV (mV) | tt | ss | ff | snfp | fnsp |
| Without compensation circuit | 600 | 1.442 | 1.681 | 1.255 | 1.58 | 1.332 |
| With compensation circuit | 600 | 0.637 | 0.76 | 0.546 | 0.665 | 0.635 |

It is seen from Table 1: under five different process corner conditions, the time required for establishing 600 mV potential difference without the compensation circuit in process corner ff is the shortest (1.255 μs); in contrast, the time required for establishing 600 mV potential difference with the compensation circuit in process corner ss is the longest (0.76 μs); hence, under five different process corner conditions, to establish the same potential difference, the circuit performance with the compensation circuit in the worst case is still superior to the circuit performance without the compensation circuit in the best case.

If the circuit is required to process signals after a fixed time difference (for example, 1 μm), the potential differences that can be established under five different process corner conditions at room temperature in the two cases are shown in Table 2:

TABLE 2

|  | ΔT (μs) | ΔV (mV) | | | | |
|---|---|---|---|---|---|---|
|  |  | tt | ss | ff | snfp | fnsp |
| Without compensation circuit | 1 | 440.8 | 381.4 | 499.9 | 404.3 | 475 |
| With compensation circuit | 1 | 955.1 | 818.6 | 1038 | 915 | 968.6 |

It is seen from Table 2: under five different process corner conditions, the potential difference that can be established without the compensation circuit after 1 us in process corner ff is the highest (499.9 mV); in contrast, the potential difference that can be established with the compensation circuit after 1 μs in process corner ss is the lowest (818.6 mV); hence, after the same time difference, the potential difference established in the circuit with the compensation circuit in the worst case is still higher than the potential difference established in the circuit without the compensation circuit in the best case; therefore, the correct signal identification of the follow-up circuit is ensured, without circuit performance loss.

Table 3 shows the time differences ΔT required to establish 600 mV potential difference at different temperatures in the two cases:

TABLE 3

|  | ΔV (mV) | ΔT (μs) | | | | | |
|---|---|---|---|---|---|---|---|
|  |  | −40° C. | −20° C. | 0° C. | 20° C. | 40° C. | 60° C. |
| Without compensation circuit | 600 | 1.304 | 1.347 | 1.385 | 1.425 | 1.465 | 1.499 |
| With compensation circuit | 600 | 0.579 | 0.598 | 0.615 | 0.631 | 0.647 | 0.611 |

It is seen from Table 3: At different temperatures, the time difference required to establish 600 mV potential difference in the circuit without compensation circuit at −40° C. is the shortest (1.304 μs); in contrast, the time difference required to establish 600 mV potential difference in the circuit with the compensation circuit at 60° C. is the longest (0.66 μs); hence, to establish the same potential difference, at different temperatures, the performance of the circuit with the compensation circuit in the worst case is still superior to the performance of the circuit without the compensation circuit in the best case.

Table 4 shows the potential differences ΔV that can be established within 1 μs after the circuit starts to work at different temperatures in the two cases:

TABLE 4

|  | ΔT (μs) | ΔV (mV) | | | | | |
|---|---|---|---|---|---|---|---|
|  |  | −40° C. | −20° C. | 0° C. | 20° C. | 40° C. | 60° C. |
| Without compensation circuit | 1 | 479.2 | 465.6 | 454.2 | 443.7 | 443.8 | 426.8 |
| With compensation circuit | 1 | 1023 | 1001 | 980.2 | 960.9 | 941.2 | 926.6 |

It is seen from Table 4: at different temperatures, the potential difference established in the circuit without compensation circuit within 1 μs at −40° C. is the highest (479.2 mV); in contrast, the potential difference established in the circuit with the compensation circuit within 1 μs at 60° C. is the lowest (926.6 mV); hence, after the same time difference, the potential difference established in the circuit with the compensation circuit in the worst case is still higher than the potential difference established in the circuit without the compensation circuit in the best case; therefore, the correct signal identification of the follow-up circuit can be ensure, without circuit performance loss.

It can be seen from the above tables: without the compensation circuit, high noise current will result in time delay in the entire circuit (for correct functionality of the circuit), as shown in Table 1 and Table 3; or, the potential difference that can be established in a fixed period of time is too low, and consequently the follow-up circuit can not identify the signals correctly (for no performance degradation in the circuit), as shown in Table 2 and Table 4. Therefore, with the noise current compensation circuit, the adverse effect of noise current on the original circuit can be eliminated, while the circuit can function correctly and the circuit performance is not degraded.

Figure 6:
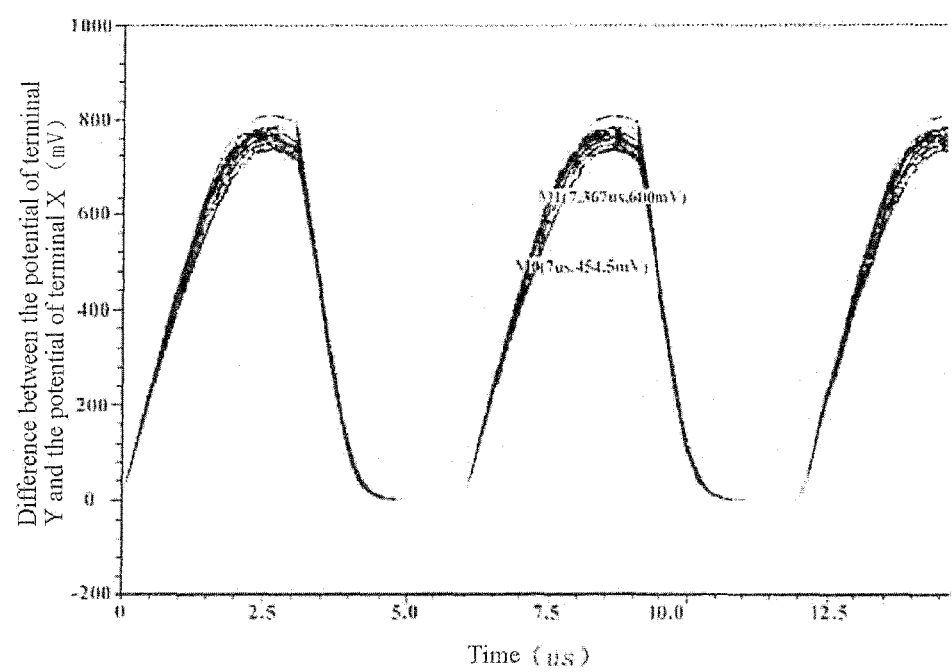
FIG. 6 is a simulated Monte Carlo oscillogram (100 cycles) of the original circuit without the noise current compensation circuit, showing the mismatch between the potential of terminal Y and the potential of terminal X.
Figure 7:
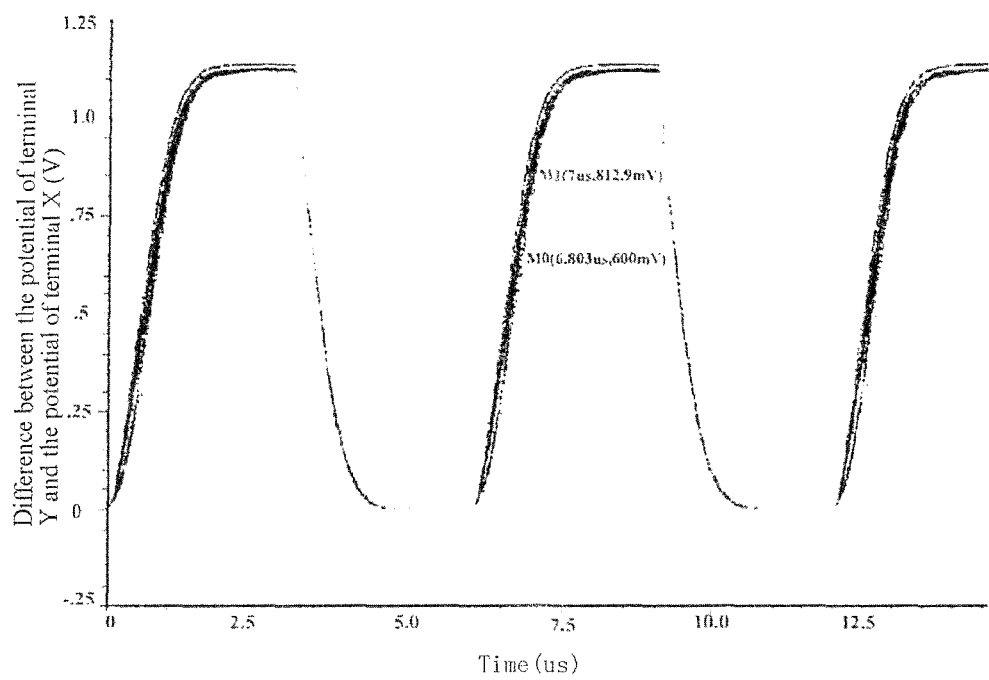
FIG. 7 is a simulated Monte Carlo oscillogram (100 cycles) of the original circuit with the noise current compensation circuit, showing the mismatch between the potential of terminal Y and the potential of terminal X.

FIG. 6 is a simulated Monte Carlo oscillogram (100 cycles) of the original circuit without the noise current compensation circuit, showing the mismatch between the potential of terminal Y and the potential of terminal X; FIG. 7 is a simulated Monte Carlo oscillogram (100 cycles) of the original circuit with the noise current compensation circuit, showing the mismatch between the potential of terminal Y and the potential of terminal X. It can be seen from the simulated oscillograms: without the noise current compensation circuit, the time difference required to establish 600 mV potential difference in the original circuit in the best case is 1.367 μs, and the potential difference that can be established within 1 μs after the circuit starts to work in the best case is 454.9 mV; with the noise current compensation circuit, the time difference required to establish 600 mV potential difference in the circuit in the worst case is 0.803 μs, and the potential difference that can be established within 1 μs after the circuit starts to work in the worst case is 812.9 mV. It is seen clearly that the performance of the circuit with the noise current compensation circuit in the worst case is still superior to the performance of the circuit without the noise current compensation circuit in the best case. As shown in FIG. 7, the simulated oscillogram has concentrated distribution, which indicates the circuit with the noise current compensation circuit has high stability.

The invention claimed is:

1. A noise current compensation circuit, comprising a first PMOS tube P1, a second PMOS tube P2, a third PMOS tube P3, a fourth PMOS tube P4, a fifth PMOS tube P5, a sixth PMOS tube P6, a seventh PMOS tube P7, a first NMOS tube N1, a second NMOS tube N2, a third NMOS tube N3, a fourth NMOS tube N4, a fifth NMOS tube N5, a sixth NMOS tube N6, a seventh NMOS tube N7, and an eighth NMOS tube N8, wherein, the source electrode of the first PMOS tube P1 is connected to the supply voltage VDD, the drain electrode of the first PMOS tube P1 is connected to an I/O terminal B, and the gate electrode of the first PMOS tube P1 is connected to the drain electrode of the second PMOS tube P2; the source electrode of the second PMOS tube P2 is connected to the supply voltage VDD, the gate electrode of the second PMOS tube P2 is connected to the gate electrode of the third NMOS tube N3 and connected to a control terminal CON; the source electrode of the third NMOS tube N3 is connected to the source electrode of the third PMOS tube P3 and connected to the drain electrode of the second PMOS tube P2, and the drain electrode of the third NMOS tube N3 is connected to the drain electrode of the third PMOS tube P3; the gate electrode of the third PMOS tube P3 is connected to the signal CONF which is complementary to the control signal CON; the drain electrode of the fourth PMOS tube P4 is connected to the drain electrode of the fourth NMOS tube N4 and connected to the drain electrode of the third PMOS tube P3; the source electrode of the fourth PMOS tube P4 is connected to the supply voltage VDD, the gate electrode of the fourth PMOS tube P4 is connected to the gate electrode of the fifth PMOS tube P5 and connected to the gate electrode of the seventh PMOS tube P7; the gate electrode of the fifth PMOS tube P5 is connected to the drain electrode of the fifth PMOS tube P5 and connected to the drain electrode of the fifth NMOS tube N5, and the source electrode of the fifth PMOS tube P5 is connected to the supply voltage VDD; the gate electrode of the fourth NMOS tube N4 is connected to the gate electrode of the seventh NMOS tube N7 and directly connected to the second I/O terminal B, the gate electrode of the fifth NMOS tube N5 is directly connected to a first I/O terminal A, the source electrode of the fourth NMOS tube N4 is connected to the source electrode of the fifth NMOS tube N5 and connected to the drain electrode of the eighth NMOS tube N8; the source electrode of the seventh PMOS tube P7 is directly connected to the supply voltage VDD, the drain electrode of the seventh PMOS tube P7 is connected to the drain electrode of the seventh NMOS tube N7, and the source electrode of the seventh NMOS tube N7 is connected to the drain electrode of the eighth NMOS tube N8; the gate electrode of the eighth NMOS tube N8 is connected to the control signal CON, and the source electrode of the eighth NMOS tube N8 is directly connected to the power ground VSS; the source electrode of the sixth PMOS tube P6 is connected to the source electrode of the sixth NMOS tube N6 and connected to the drain electrode of the seventh NMOS tube N7, and the drain electrode of the sixth PMOS tube P6 is connected to the drain electrode of the sixth NMOS tube N6 and connected to the gate electrode of the first NMOS tube N1; the gate electrode of the sixth PMOS tube P6 is directly connected to the control signal CONF; the gate electrode of the sixth NMOS tube N6 is directly connected to the control signal CON; the gate electrode of the second NMOS tube N2 is directly connected to the control signal CONF, the source electrode of the second NMOS tube N2 is directly connected to the power ground VSS, and the drain electrode of the second NMOS tube N2 is connected to the gate electrode of the first NMOS tube N1; the source electrode of the first NMOS tube N1 is directly connected to the power ground VSS, and the drain electrode of the first NMOS tube N1 is directly connected to the second I/O terminal B;

In addition, the body terminals of the first PMOS tube P1, second PMOS tube P2, third PMOS tube P3, fourth PMOS tube P4, fifth PMOS tube P5, sixth PMOS tube P6, and seventh PMOS tube P7 are connected to the supply voltage VDD respectively; the body terminals of the first NMOS tube N1, second NMOS tube N2, third NMOS tube N3, fourth NMOS tube N4, fifth NMOS tube N5, sixth NMOS tube N6, seventh NMOS tube N7, and eighth NMOS tube N8 are connected to the power ground VSS respectively.

* * * * *